United States Patent
Fermon et al.

(10) Patent No.: US 8,129,988 B2
(45) Date of Patent: Mar. 6, 2012

(54) METHOD AND SYSTEM FOR ADJUSTING THE SENSITIVITY OF A MAGNETORESISTIVE SENSOR

(75) Inventors: Claude Fermon, Orsay (FR); Myriam Pannetier-Lecoeur, Bures sur Yvette (FR)

(73) Assignee: Commissariat a l'Energie Atomique et Aux Energies Alternatives, Paris (FR)

( * ) Notice: Subject to any disclaimer, the term of this patent is extended or adjusted under 35 U.S.C. 154(b) by 320 days.

(21) Appl. No.: 12/305,042

(22) PCT Filed: Jun. 22, 2007

(86) PCT No.: PCT/FR2007/051501
§ 371 (c)(1),
(2), (4) Date: May 13, 2009

(87) PCT Pub. No.: WO2007/148028
PCT Pub. Date: Dec. 27, 2007

(65) Prior Publication Data
US 2009/0309581 A1 Dec. 17, 2009

(30) Foreign Application Priority Data

Jun. 22, 2006 (FR) ..................................... 06 52598

(51) Int. Cl.
*G01R 33/02* (2006.01)
(52) U.S. Cl. ...................................................... 324/252
(58) Field of Classification Search ........................ None
See application file for complete search history.

(56) References Cited

U.S. PATENT DOCUMENTS

| | | | | |
|---|---|---|---|---|
| 3,286,161 A | * | 11/1966 | Jones et al. | 323/353 |
| 3,522,390 A | * | 7/1970 | Wieder | 369/136 |
| 3,848,217 A | * | 11/1974 | Lazzari | 338/32 R |
| 3,945,038 A | * | 3/1976 | Lazzari | 360/315 |
| 4,053,829 A | | 10/1977 | Maruo | |
| 4,296,377 A | | 10/1981 | Ohkubo | |
| 4,361,805 A | | 11/1982 | Narimatsu et al. | |
| 6,066,947 A | * | 5/2000 | Tamura | 324/207.21 |
| 6,219,275 B1 | * | 4/2001 | Nishimura | 365/173 |
| 6,452,382 B1 | * | 9/2002 | Tokunaga et al. | 324/207.21 |
| 7,054,118 B2 | | 5/2006 | Daughton et al. | |
| 2004/0096700 A1 | | 5/2004 | Scmollngruber et al. | |
| 2004/0201378 A1 | * | 10/2004 | Sugano | 324/234 |
| 2004/0248327 A1 | | 12/2004 | Onaka | |

* cited by examiner

*Primary Examiner* — Paresh Patel
(74) *Attorney, Agent, or Firm* — Weingarten, Schurgin, Gagnebin & Lebovici LLP

(57) ABSTRACT

The system for measuring high currents or magnetic fields using a magnetoresistive sensor (80) includes a device for applying a known predetermined magnetic bias field $H_{bias}$ in a direction such that it has a non-zero component of the field perpendicular to a detection direction of the magnetoresistive sensor (80) that also corresponds to a direction of anisotropy of a layer of the magnetoresistive sensor, a device for measuring the variation in resistance of the magnetoresistive sensor (80) and means for determining the external magnetic field H to be measured from the measured resistance variation, the resistance of the sensor being subjected to a monotonic variation function.

3 Claims, 3 Drawing Sheets

METHOD AND SYSTEM FOR ADJUSTING THE SENSITIVITY OF A MAGNETORESISTIVE SENSOR

The present invention relates to a method and a system for adjusting the sensitivity of a magnetoresistive sensor.

Magnetoresistive sensors such as anisotropic magnetoresistance (AMR) sensors, giant magnetoresistance (GMR) sensors, or tunnel magnetoresistance (TMR) sensors are very frequently used to measure magnetic fields, especially in read heads.

Magnetoresistive sensors are characterized by a wide variation in a weak magnetic field, which makes them highly sensitive for measuring weak magnetic fields.

At the present time, to measure relatively high magnetic fields (>10 milliteslas (mT)), Hall effect sensors are generally used, which have the advantage of being linear up to very high field values (>15 teslas (T)). However, in weak magnetic fields the sensitivity of Hall effect sensors is low compared to that of magnetoresistive sensors.

Other known magnetoresistive systems include systems including colossal magnetoresistance (CMR) sensors, which exhibit a non-negligible resistance variation over a wide range of magnetic field values. The linearity of those systems is poor, however, and they lack temperature stability.

It is also known to use magnetic fields produced by permanent magnets to increase sensitivity to magnetoresistive behavior and in particular to reduce the electrical noise created during the formation of measurement magnetic domains (see the documents GB 2 272 561 A, WO 95/35508, and WO 96/28812, for example).

The document DE 1011313A relates to magnetoresistive sensors in which linearity is improved by applying a known magnetic field created by permanent magnets.

There nevertheless remains a need for magnetoresistive sensors with a response that can be modified to adjust their sensitivity, in particular for measuring high magnetic fields or high currents.

The present invention therefore aims to remedy the drawbacks of known systems for measuring magnetic fields by means of magnetoresistive sensors and to improve the limited response of such sensors to an applied magnetic field.

In particular, a magnetoresistive sensor such as an AMR, GMR, or TMR sensor has a field response that is limited by rapid saturation.

The invention aims to measure high magnetic fields or high currents using magnetoresistive sensors.

The above objects are achieved by a method of adjusting the sensitivity of a device including a magnetoresistive sensor and increasing the range of response of that device to an external magnetic field, the method being characterized in that it consists in applying a known predetermined magnetic bias field $H_{bias}$ in a direction such that it has a non-zero component of the field perpendicular to a detection direction of said magnetoresistive sensor that also corresponds to a direction of anisotropy of a layer of the magnetoresistive sensor, so that the magnetic field to be measured can be determined by a monotonic function from the resistance variation of said magnetoresistive sensor.

More particularly, when the known predetermined bias magnetic field $H_{bias}$ is applied to extend the range of response of the device including a magnetoresistive sensor for measuring an external magnetic field H, the response of said device is determined by dividing the external magnetic field H to be measured by the square root of the sum of the squares of the external magnetic field H to be measured and the predetermined bias magnetic field $H_{bias}$.

A magnetoresistive sensor design combining clearly defined anisotropy with application of a bias magnetic field $H_{bias}$ in the direction of that anisotropy generally has a precise and predictable response, even in the presence of high external magnetic fields.

When the method is used to adjust the sensitivity of a device including an anisotropic magnetoresistance sensor, the known predetermined bias magnetic field $H_{bias}$ is applied in a direction such that it has a non-zero field component in a direction perpendicular to the direction of flow of the current in said sensor.

When the method is used to adjust the sensitivity of a device including a giant magnetoresistance sensor or a tunnel magnetoresistance sensor including a hard ferromagnetic layer trapped in a reference direction, the known predetermined bias magnetic field $H_{bias}$ is applied in a direction such that it has a non-zero field component in a direction perpendicular to said reference direction of the hard ferromagnetic layer.

In a method conforming to one implementation of the invention, the known predetermined bias magnetic field $H_{bias}$ is not homogeneous and is subject to known variations between a minimum value $H_{biasmin}$ and a maximum value $H_{biasmax}$.

The invention also provides a system for measuring high currents or magnetic fields using a magnetoresistive sensor, the system being characterized in that it includes means for applying a known predetermined magnetic bias field $H_{bias}$ in a direction such that it has a non-zero component of the field perpendicular to a detection direction of said magnetoresistive sensor that also corresponds to a direction of anisotropy of a layer of said magnetoresistive sensor, means for measuring the variation in resistance of said magnetoresistive sensor, and means for determining the external magnetic field H to be measured from the measured resistance variation, the resistance of the sensor being subjected to a monotonic variation function.

In one particular embodiment, the magnetoresistive sensor is an anisotropic magnetoresistance and the means for applying a known predetermined bias magnetic field $H_{bias}$ are such that said field has a non-zero field component perpendicular to the flow of current in said sensor.

In another particular embodiment, the magnetoresistive sensor is a giant magnetoresistance sensor or a tunnel magnetoresistance sensor including a hard ferromagnetic layer trapped in a reference direction and the means for applying a known predetermined bias magnetic field $H_{bias}$ are such that said field has a non-zero field component in a direction perpendicular to said reference direction of the hard ferromagnetic layer.

The system of the invention can be implemented so that the magnetoresistive sensor is C-shaped with square corners or of serpentine shape with short transverse arms and longer longitudinal arms, the longer arms being aligned in the direction of the axis of easy magnetization of soft ferromagnetic layers in said sensor and in the direction of said known predetermined bias magnetic field $H_{bias}$.

In one possible embodiment, the means for applying a known predetermined bias magnetic field $H_{bias}$ include a permanent magnet.

A first option is then for the permanent magnet to be above or below said magnetoresistive sensor and to have planar magnetization.

Another option is for the system to include a permanent magnet alongside said magnetoresistive sensor with its magnetization directed to create a planar field in said sensor.

According to one particular feature of the invention, the permanent magnet is such that the thermal variations of the remnant magnetic field created by the permanent magnet compensate the variation in the sensitivity of the magnetoresistive sensors.

For example, the permanent magnet(s) can be formed by electrodeposition or by screenprinting or lithographically printing deposited magnetic layers.

In another possible embodiment, the means for applying a known predetermined bias magnetic field $H_{bias}$ include at least an electromagnet.

The system can then include means for adjusting the current flowing in said electromagnet to compensate the thermal variations in the sensitivity of the magnetoresistive sensor.

In a further embodiment, the magnetoresistive sensor is placed near a conductive wire carrying a current to be measured, the system includes means for determining said current from the value of the magnetic field produced by said current and detected by said magnetoresistive sensor, and the magnetoresistive sensor and said conductive wire are disposed so that said detected magnetic field is perpendicular to said known predetermined bias magnetic field $H_{bias}$.

Other features and advantages of the invention emerge from the following description of particular embodiments of the invention given with reference to the appended drawings, in which.

Magnetoresistive sensors include a soft ferromagnetic layer, generally of NiFe or NiFe/CoFe, whose magnetization direction can turn freely in a plane if an external magnetic field is applied.

In anisotropic magnetoresistance (AMR) sensors, the resistance varies with the angle $\theta$ between the magnetization of the soft layer and the direction of the injected current.

In giant magnetoresistance (GMR) or tunnel magnetoresistance (TMR) sensors, the resistance varies with the angle $\theta$ between the magnetization of the soft layer and the magnetization of a hard ferromagnetic layer that constitutes a reference layer.

The resistance R of the sensor as a function of the angle $\theta$ can be expressed as follows in terms of components $R_0$ and $R_1$:

$$R = R_0 + R_1 \cos \theta \quad (1)$$

For GMR sensors, the ratio $R_1/R_0$ can vary from 0.05 to 0.15 and for TMR sensors the ratio $R_1/R_0$ can reach values of the order of 4 at room temperature.

The measurement direction is usually given as $\theta=0$.

The angle $\theta$ is the angle between the magnetization of the soft ferromagnetic layer and the reference direction (the direction of the reference layer or the direction of the current).

The magnetization of the soft ferromagnetic layer follows the external magnetic field.

Figure 1:
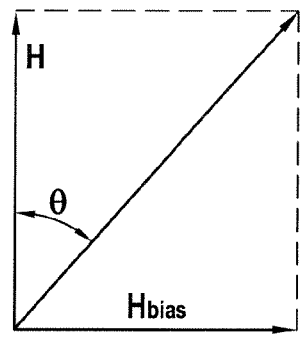
FIG. 1 shows the components of the applied magnetic field in the method of the invention.

According to the invention, a bias magnetic field $H_{bias}$ having a known particular value is applied in the plane of the sensor at an angle of $\pi/2$ relative to the detection direction of the magnetoresistive sensor responsive to a magnetic field H (FIG. 1).

If the bias magnetic field $H_{bias}$ is constant, the variation of the resistance of the sensor as a function of the applied external magnetic field H is given by the following formula:

$$R = R_0 + R_1 \cos\theta = R_0 + R_1 \frac{H}{\sqrt{H^2 + H_{bias}^2}} \quad (2)$$

For low magnetic fields H, the resistance variation is linear:

$$R = R_0 + R_1 \cos\theta = R_0 + R_1 \frac{H}{H_{bias}}$$

The next order term in the expansion of equation (2) is given by $$R_1 \frac{H^3}{2H_{bias}^2}.$$

The sensitivity can be deduced from equation (2), expressed in the following form:

$$\frac{R_1 H_{bias}^2}{(H^2 + H_{bias}^2)^{3/2}} \quad (3)$$

The reciprocal of equation (2) can be calculated directly by processing the acquired data.

It follows that if a resistance variation $\delta R = R_1 \cos \theta$ is observed, the applied external field H can be deduced from it as follows:

$$H = \frac{\delta R / R_1}{\sqrt{1 - (\delta R / R_1)^2}} H_{bias}$$

To measure a current flowing in a conductive wire, it is sufficient to measure the magnetic field created by that current outside the conductor. If the current flowing in the conductive wire is I, the approximate value of the magnetic field H created at a distance $\underline{r}$ from the conductor is given by the formula:

$$\mu_0 \frac{I}{2r}$$

in which $\mu_0$ is the magnetic permeability in a vacuum.

GMR or TMR sensors can be used with advantage as the magnetoresistive sensors. GMR sensors have a lower resistance variation than TMR sensors, however they accept a higher current and have lower noise at low frequencies.

Figure 2A:
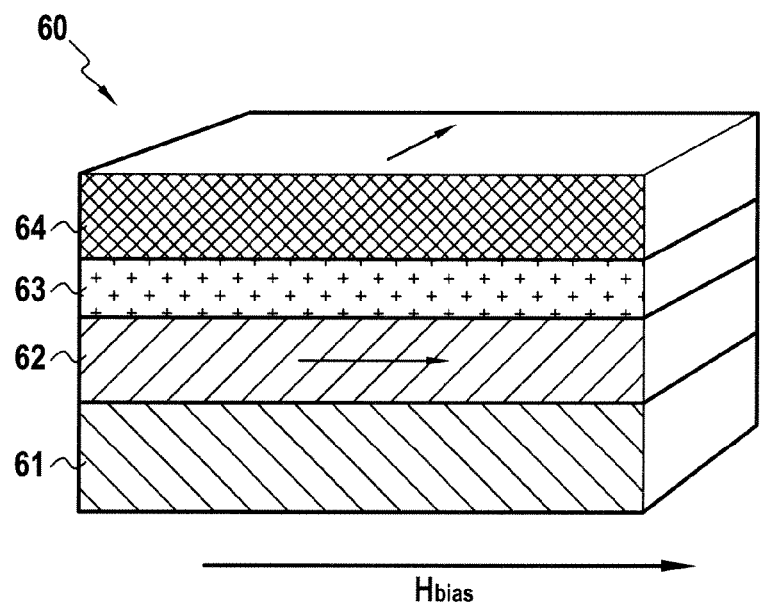
FIG. 2a is a diagram showing in section a stack of layers constituting a giant magnetoresistance (GMR) sensor.
Figure 2B:
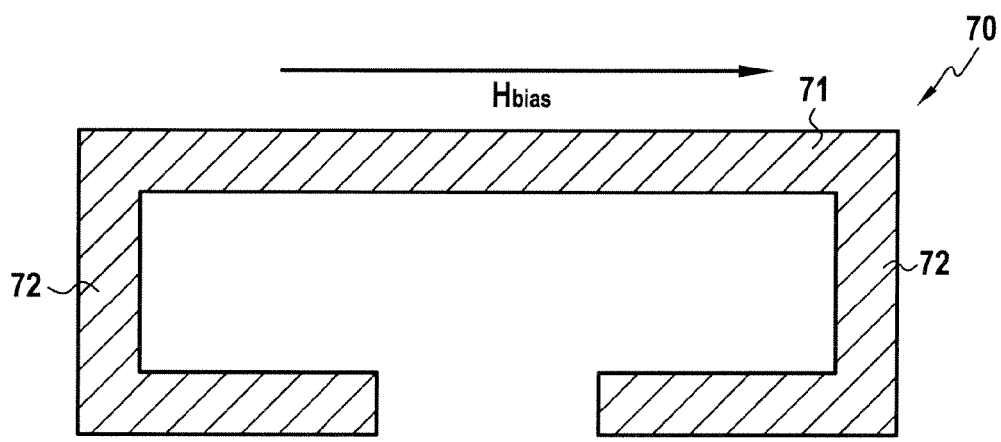
FIG. 2b shows an example of a GMR sensor configuration that is C-shaped with square corners.
Figure 2C:
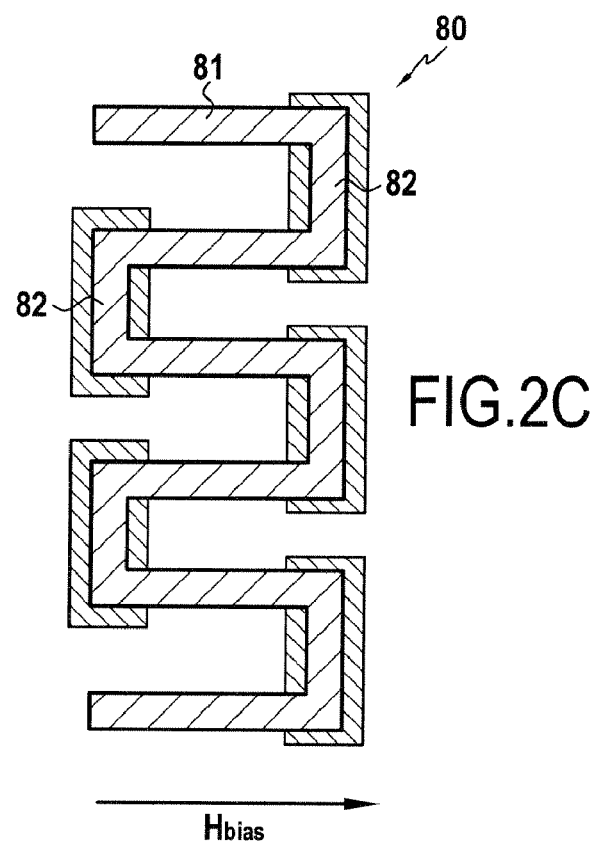
FIG. 2c shows another example of a GMR sensor configuration, of serpentine shape.

FIG. 2 shows an example of a stack of layers constituting a GMR sensor having a crossed-anisotropy spin valve configuration. A soft ferromagnetic layer or free layer 62 has an easy magnetization axis perpendicular to a hard ferromagnetic layer or reference layer 64 of the spin valve.

The free layer 62 usually consists of two layers of NiFe and CoFe. It is separated from the reference layer 64 by a thin copper layer 63.

The reference layer 64 consists of an antiferromagnetic layer coupled to a ferromagnetic layer and can include a CoFe/IrMn stack, for example. In a different embodiment, the reference layer 64 can contain an antiferromagnetic assembly such as an assembly of three layers forming a CoFe/Ru/CoFe stack.

The bias magnetic field $H_{bias}$ is applied in the direction of the easy magnetization axis of the free layer 62 and the external magnetic field to be measured is applied in the direction of the reference layer 64.

An artificial antiferromagnetic assembly has the advantage of being insensitive to the applied external field and in particular to the bias magnetic field $H_{bias}$, and therefore of producing a very low error when using formula (2), even in a high field.

A GMR sensor stack 60 is conventionally associated by the microfabrication process with a set of contacts for two or four measurement points.

A stack of GMR sensors can be C-shaped with square corners (like the stack 70 in FIG. 2b) with a longitudinal arm 71 and two shorter transverse arms 72, or of serpentine shape (like the stack 80 in FIG. 2c) with longitudinal arms 81 and shorter connecting transverse arms 82 that are short-circuited to reduce magnetic noise.

The longitudinal arms 71, 81 are always aligned with the easy magnetization axis of the free layer and therefore with the direction of the bias magnetic field $H_{bias}$.

A magnetic field $H_{bias}$ can be created in the plane of one or more GMR sensors 90 using one or more permanent magnets 110, 121, 122.

Figure 3:
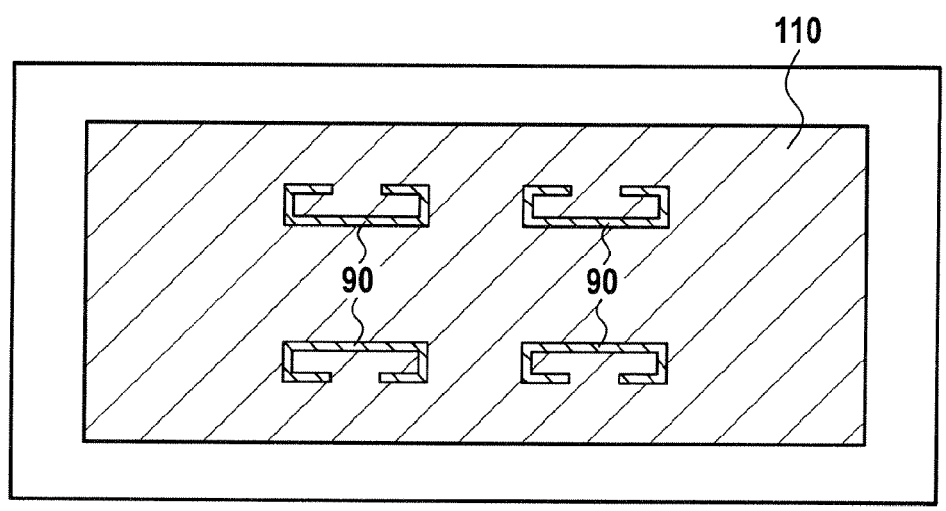
FIG. 3 is a diagram showing a set of GMR sensors associated with an integrated permanent magnet located above the sensors.
Figure 4:
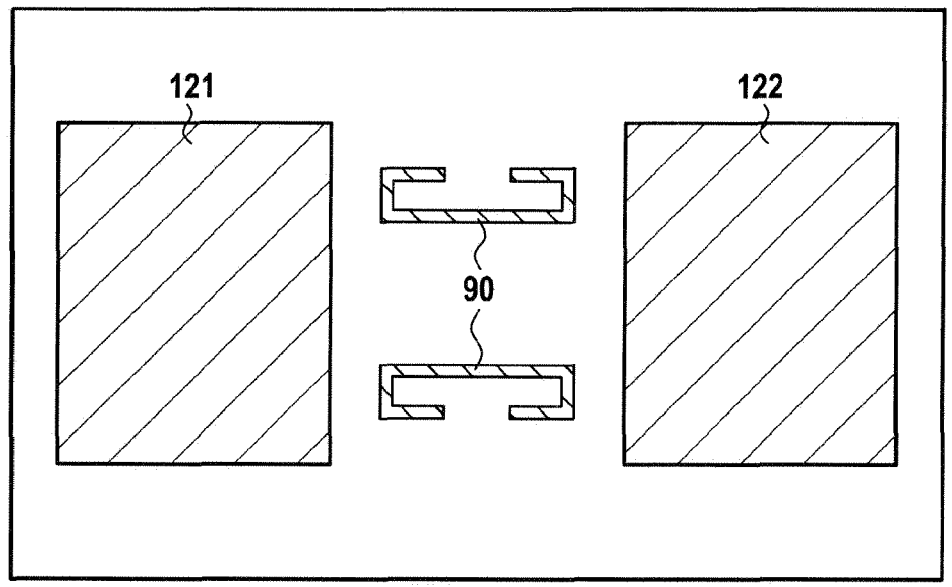
FIG. 4 is a diagram showing a set of GMR sensors associated with permanent magnets disposed laterally relative to the sensors.

Thus a permanent magnet 110 can be placed above or below magnetoresistive sensors 90 with planar magnetization (FIG. 3).

One or more permanent magnets 121, 122 can also be disposed alongside magnetoresistive sensors 90, also with planar magnetization or with orthogonal magnetization oriented to create a planar field in the sensors 90.

The permanent magnets 110, 121, 122 can be arranged to create a homogeneous magnetic field $H_{bias}$ and their composition can be chosen as a function of the required magnetic properties and the fabrication techniques chosen. Permanent magnets based on rare earths, for example consisting of NbFeB or SmCo alloys, have the advantage of a high remnant field and very high coercivity.

A permanent magnet fabrication process compatible with fabrication of microsensors on microwafers uses screenprinting techniques employing inks containing hard magnet powders. Coercivities up to 2 T and remnant fields up to 1 T can be obtained in this way.

Another fabrication process uses electrodeposition techniques. This technique can easily be used to deposit CoPt alloys to obtain the required final shape.

To create a homogeneous bias magnetic field $H_{bias}$ for the sensors 90, sufficiently large and sufficiently thick permanent magnets must be chosen for the magnetic field created to be sufficiently high.

The bias magnetic field $H_{bias}$ can equally be created by an electromagnet, which makes it easier to adjust sensitivity and immunity to applied external fields, but entails some consumption of current.

Figure 5:
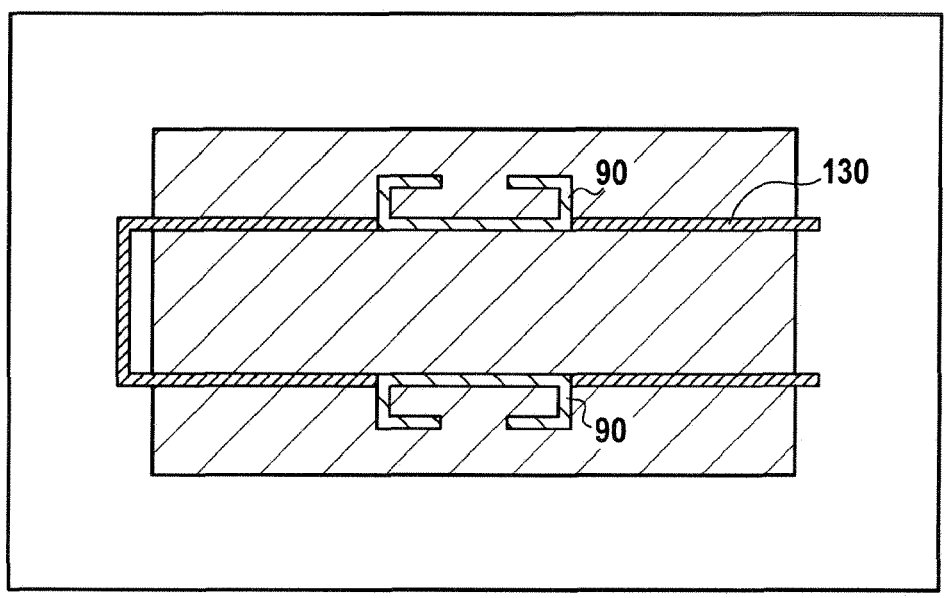
FIG. 5 is a diagram showing an example of a device of the invention adapted to measure current in a conductive wire.

FIG. 5 shows one example of a current measuring device of the invention with a conductive line 130 for the current to be measured disposed in the vicinity of the magnetoresistive sensors 90.

When measuring current, as already indicated above, predicting the distance between the conductive line and the magnetoresistive sensors is important. In one advantageous embodiment, illustrated in FIG. 5, the conductive line 130 is integrated close to the sensors 90 during the microfabrication thereof.

The conductive line 130 is advantageously the same width as the sensors 90, but can be slightly wider than them if necessary.

For example, with a sensor 90 that is 5 micrometers (μm) wide and an integrated conductive line 130, currents of up to 100 milliamps (mA) can be measured with an accuracy of better than 0.1%. Here the value of the magnetic field detected by the sensors 90 is approximately 50 oersted (Oe).

In a different embodiment, suited to higher currents, a conductive wire is placed on the face of the wafer carrying the sensors 90 opposite that carrying the sensors 90 and their connections. The distance between a sensor and the conductive wire is then determined by the thickness of the wafer.

In a further embodiment, a field concentrator can be used if greater freedom is required for positioning the conductive wire relative to the sensors.

Considering equations (1) and (2) again, note that the performance of a magnetoresistive sensor depends on variations as a function of temperature.

Usually, the value $R_1$ decreases as a function of temperature and the value $R_0$ increases as a function of temperature.

The variation of the value $R_0$ as a function of temperature can be eliminated using a Wheatstone bridge or half-bridge configuration including sensors enabling differential measurement.

The variation of the value $R_1$ as a function of temperature is more difficult to compensate.

However, if the bias magnetic field $H_{bias}$ itself decreases according to the same law as the value $R_1$, equation (2) shows that there is first order compensation of the decrease in $R_1$.

To this end a permanent magnet can be used with a sufficiently low critical temperature or a bias magnetic field $H_{bias}$ can be applied using a coil including means for adjustment as a function of the temperature variation.

A low alternating field can then be applied to detect the sensitivity of the sensor and, using a feedback loop, the current in the coil can be adjusted to maintain the sensitivity at the same value. This option accurately corrects variations in the value $R_1$ as a function of temperature.

If the bias magnetic field is generated by a current flowing in a loop, the excitation can be effected during measurement of the external field H either by a constant current or by pulses stabilized at a constant value.

In a different embodiment, the bias magnetic field $H_{bias}$ is applied at an angle α relative to the direction of magnetization of the free layer of the sensor. The component of the bias field along the axis of the hard layer centers the response of the magnetoresistive sensor and therefore produces a perfectly symmetrical sensor response.

The bias magnetic field $H_{bias}$ can equally be applied without contact. Because the linearity of the sensor and its range of operation depend on the intensity of the bias magnetic field, changing the distance between the bias field $H_{bias}$ and the sensor changes the operating range.

This range can also be modified without contact by modifying the distance between the sensor and the means for applying the bias magnetic field $H_{bias}$, to adjust the range of operation to required values. This is advantageous in particular when the sensor is in an encapsulated environment and the magnitude to be measured (magnetic field H or current) changes.

To effect these adjustments, either the distance between a permanent magnet and a sensor is adjusted or, if the bias magnetic field $H_{bias}$ is applied by means of an electromagnet, the current in the electromagnet is adjusted.

If the applied bias magnetic field $H_{bias}$ is homogeneous, equation (2) shows that the sensitivity decreases as a function of the field in accordance with equation (3), decreasing with the cube of the value of the magnetic field in a strong field.

For a smaller decrease in sensitivity, it is possible to apply a bias field $H_{bias}$ that is not homogeneous. This can be achieved using permanent magnets or electromagnets.

Thus different parts of the measuring system can have different sensitivities.

With a bias magnetic field $H_{bias}$ that changes linearly between a nominal value $H_{biasmin}$ and a maximum value $H_{biasmax}$, the response given by equation (2) is modified to yield the response given by equation (4) below:

$$R = R_0 + R_1\cos\theta = R_0 + \frac{R_1}{(H_{bias\,max} - H_{bias\,min})}\int_{H_{bias\,min}}^{H_{bias\,max}} \frac{H}{\sqrt{H^2+u^2}} du \quad (4)$$

The sensitivity is then given by the following equation:

$$\frac{R_1}{(H_{bias\,max} - H_{bias\,min})}\int_{H_{bias\,min}}^{H_{bias\,max}} \frac{u^2}{(H^2+u^2)^{3/2}} du \quad (5)$$

The invention claimed is:

1. A method of adjusting the sensitivity of a device including a magneto-resistive sensor and increasing the range of response of that device to an external magnetic field, characterized in that it consists in applying a known predetermined magnetic bias field $H_{bias}$ that is not homogeneous and is subject to known variations between a minimum value $H_{biasmin}$ and a maximum value $H_{biasmax}$ in a direction such that it has a non-zero component of the field perpendicular to a detection direction of said magnetoresistive sensor that also corresponds to a direction of anisotropy of a layer of the magnetoresistive sensor, so that the magnetic field to be measured can be determined by a monotonic function from the resistance variation of said magneto-resistive sensor, wherein the bias magnetic field is caused to vary linearly between the minimum value $H_{biasmin}$ and the maximum value $H_{biasmax}$, and wherein the resistance R of said magnetoresistive sensor is given by the following equation:

$$R = R_0 + \frac{R_1}{(H_{bias\,max} - H_{bias\,min})}\int_{H_{bias\,min}}^{H_{bias\,max}} \frac{H}{\sqrt{H^2+u^2}} du$$

where:
$R_0$ is the resistance of the magnetoresistive sensor in the absence of an external field;
$R_1$ is the component of the resistance of the magnetoresistive sensor that is affected by the presence of an external magnetic field;
H is the external magnetic field to be measured; and
u is the variable varying from the minimum value $H_{biasmin}$ to the maximum value $H_{biasmax}$ of the bias magnetic field $H_{bias}$.

2. A method according to claim 1, for adjusting the sensitivity of a device including an anisotropic magnetoresistance sensor, characterized in that the known predetermined bias magnetic field $H_{bias}$ is applied in a direction such that it has a non-zero field component in a direction perpendicular to the direction of flow of the current in said sensor.

3. A method according to claim 1, for adjusting the sensitivity of a device including a giant magnetoresistance sensor or a tunnel magnetoresistance sensor including a hard ferromagnetic layer trapped in a reference direction, characterized in that the known predetermined bias magnetic field $H_{bias}$ is applied in a direction such that it has a non-zero field component in a direction perpendicular to said reference direction of the hard ferromagnetic layer.

* * * * *

UNITED STATES PATENT AND TRADEMARK OFFICE
CERTIFICATE OF CORRECTION

PATENT NO. : 8,129,988 B2
APPLICATION NO. : 12/305042
DATED : March 6, 2012
INVENTOR(S) : Claude Fermon et al.

It is certified that error appears in the above-identified patent and that said Letters Patent is hereby corrected as shown below:

Column 3, line 3, "remnant" should read --remanent--;

Column 5, line 49, "remnant" should read --remanent--; and

Column 5, line 54, "remnant" should read --remanent--.

Signed and Sealed this
Twelfth Day of March, 2013

Teresa Stanek Rea
*Acting Director of the United States Patent and Trademark Office*